US012136597B2

(12) United States Patent
Tsai et al.

(10) Patent No.: US 12,136,597 B2
(45) Date of Patent: Nov. 5, 2024

(54) SEMICONDUCTOR PACKAGE HAVING AN INTERPOSER IN WHICH ONE OR MORE DIES ARE FORMED AND METHOD OF FORMING THE SAME

(71) Applicant: MEDIATEK INC., Hsinchu (TW)

(72) Inventors: Yi-Lin Tsai, Hsinchu (TW); Nai-Wei Liu, Hsinchu (TW); Wen-Sung Hsu, Hsinchu (TW)

(73) Assignee: MEDIATEK INC., Hsinchu (TW)

( * ) Notice: Subject to any disclaimer, the term of this patent is extended or adjusted under 35 U.S.C. 154(b) by 414 days.

(21) Appl. No.: 17/515,864

(22) Filed: Nov. 1, 2021

(65) Prior Publication Data

US 2022/0157732 A1 May 19, 2022

Related U.S. Application Data

(60) Provisional application No. 63/113,216, filed on Nov. 13, 2020.

(51) Int. Cl.
*H01L 23/538* (2006.01)
*H01L 21/48* (2006.01)
(Continued)

(52) U.S. Cl.
CPC ...... *H01L 23/5389* (2013.01); *H01L 21/4853* (2013.01); *H01L 21/4857* (2013.01);
(Continued)

(58) Field of Classification Search
CPC .................................................. H01L 23/5389
See application file for complete search history.

(56) References Cited

U.S. PATENT DOCUMENTS 10,333,623 B1 6/2019 Liao et al.
10,784,248 B2 9/2020 Yu et al.
(Continued)

FOREIGN PATENT DOCUMENTS

DE    10 2019 109 592 A1    10/2020
TW         201110309 A1    3/2011
TW         201730989 A     9/2017

OTHER PUBLICATIONS

Chinese language office action dated Jun. 22, 2022, issued in application No. TW 110142223.
(Continued)

*Primary Examiner* — Lex H Malsawma
*Assistant Examiner* — Bruce R. Smith
(74) *Attorney, Agent, or Firm* — McClure, Qualey & Rodack, LLP

(57) ABSTRACT

A semiconductor package includes a first die structure, a first redistribution structure that is disposed on the first die structure, a second die structure that is disposed on the first redistribution structure, and a second redistribution structure that is disposed on the second die structure. The first die structure includes an interposer, and the interposer includes a semiconductor substrate and through-vias that penetrate through the semiconductor substrate. A first integrated circuit die is disposed in the semiconductor substrate of the interposer. The second die structure includes a second integrated circuit die that is encapsulated in an encapsulant and several conductive pillars that penetrate through the encapsulant. The first integrated circuit die is electrically connected to the second integrated circuit die through the first redistribution structure, the conductive pillars, and the second redistribution structure.

31 Claims, 7 Drawing Sheets

(51) Int. Cl.
  *H01L 21/56*   (2006.01)
  *H01L 21/78*   (2006.01)
  *H01L 23/00*   (2006.01)
  *H01L 23/31*   (2006.01)
  *H01L 25/00*   (2006.01)
  *H01L 25/065*  (2023.01)

(52) U.S. Cl.
  CPC ............ *H01L 21/565* (2013.01); *H01L 21/78* (2013.01); *H01L 23/3128* (2013.01); *H01L 23/5383* (2013.01); *H01L 23/5386* (2013.01); *H01L 24/19* (2013.01); *H01L 24/20* (2013.01); *H01L 25/0652* (2013.01); *H01L 25/50* (2013.01); *H01L 2224/214* (2013.01); *H01L 2225/06524* (2013.01); *H01L 2225/06548* (2013.01); *H01L 2225/06586* (2013.01)

(56) References Cited

U.S. PATENT DOCUMENTS

| | | | |
|---|---|---|---|
| 11,380,655 B2 | 7/2022 | Yu et al. | |
| 2011/0068444 A1* | 3/2011 | Chi | H01L 23/5389 257/E21.705 |
| 2013/0105991 A1* | 5/2013 | Gan | H01L 24/19 257/777 |
| 2015/0303174 A1 | 10/2015 | Yu et al. | |
| 2020/0091123 A1 | 3/2020 | Sung et al. | |
| 2021/0043608 A1* | 2/2021 | Yu | H01L 25/18 |

OTHER PUBLICATIONS

German language office action dated Jul. 27, 2023, issued in application No. DE 10 2021 128 933.5.

* cited by examiner

SEMICONDUCTOR PACKAGE HAVING AN INTERPOSER IN WHICH ONE OR MORE DIES ARE FORMED AND METHOD OF FORMING THE SAME

CROSS REFERENCE TO RELATED APPLICATIONS

This Application is based on, and claims priority of U.S. Provisional Application No. 63/113,216 filed on Nov. 13, 2020, the entirety of which is incorporated by reference herein.

BACKGROUND OF THE INVENTION

Field of the Invention

The present invention relates to a semiconductor package and a method of forming the same, and in particular to a semiconductor package having three-dimensional stacking integrated circuit dies and a method of forming the same.

Description of the Related Art

In order to ensure miniaturization and multi-functionality of electronic products and communication devices, semiconductor packages with integrated circuit dies are designed to be small in size to support high operating speeds and high functionality. The demand for increasing input-output (I/O) counts and high-performance integrated circuit (IC) dies has led to the development of semiconductor packages. For two-dimensional IC formation, the volume occupied by the integrated components is essentially on the surface of the semiconductor wafer. Although dramatic improvements in lithography have resulted in considerable improvements in two-dimensional (2D) IC formation, there are physical limits to the integration density that can be achieved in two dimensions.

To further increase integration density, an interposer having through-vias, such as a silicon interposer having through-silicon-vias (TSVs), has been adopted in a stacking structure. In 2.5D semiconductor package fabrication process, several IC dies are first attached to the silicon interposer having TSVs in a side-by-side arrangement. The IC dies are attached to the silicon interposer using micro-bumps. The silicon interposer is then attached to a package substrate, followed by a singulation process. The resulting stacked structure can be mounted on a printed circuit board.

Although existing semiconductor packages have been adequate for their intended purposes, they have not been entirely satisfactory in all respects. For example, die-to-die connection in the 2.5D semiconductor package by micro bumps does not provide sufficient I/O counts and/or interconnects. Also, the operation efficiency of 2.5D semiconductor package needs to be increased to meet package performance requirements as the requirements on semiconductor package fabrication of high-density integration continue to rise. Therefore, there are still some problems to be overcome in regards to semiconductor packages in the field of semiconductor integrated circuit technology.

BRIEF SUMMARY OF THE INVENTION

Some embodiments of the present disclosure provide semiconductor packages. An exemplary embodiment of a semiconductor package includes a first die structure, a first redistribution structure disposed on the first die structure, a second die structure disposed on the first redistribution structure and a second redistribution structure disposed on the second die structure. In some embodiments, the first die structure includes an interposer, and the interposer includes a semiconductor substrate and through-vias that penetrate through the semiconductor substrate. In some embodiments, a first integrated circuit die is disposed in the semiconductor substrate of the interposer. In some embodiments, the second die structure includes a second integrated circuit die that is encapsulated in an encapsulant and several conductive pillars that penetrate through the encapsulant. In some embodiments, the first integrated circuit die is electrically coupled to the second integrated circuit die through the first redistribution structure, the conductive pillars and the second redistribution structure.

Some embodiments of the present disclosure provide semiconductor packages. An exemplary embodiment of a semiconductor package includes a first die structure, a first redistribution structure disposed on the first die structure, a second die structure disposed on the first redistribution structure and a second redistribution structure disposed on the second die structure. In some embodiments, the first die structure includes a first integrated circuit die that is disposed in a semiconductor substrate of an interposer. The interposer has through-vias that penetrate through the semiconductor substrate. In some embodiments, the second die structure includes a second integrated circuit die that is encapsulated in an encapsulant and several conductive pillars that penetrate through the encapsulant. In some embodiments, top surfaces of bond pads of the first integrated circuit die are in physical contact with the first redistribution structure, and top surfaces of bond pads of the second integrated circuit die are in physical contact with the second redistribution structure.

Some embodiments of the present disclosure provide a method of forming a semiconductor package. First, a first die structure that includes a first integrated circuit die disposed in a semiconductor substrate of an interposer is provided. The interposer has through-vias that penetrate through the semiconductor substrate. The method of forming the semiconductor package also includes forming a first redistribution structure on the first die structure and forming a second die structure on the first redistribution structure. In some embodiments, the second die structure includes a second integrated circuit die that is encapsulated in an encapsulant and conductive pillars that penetrate through the encapsulant. The method of forming the semiconductor package also includes forming a second redistribution structure on the second die structure. In some embodiments, the first integrated circuit die is electrically coupled to the second integrated circuit die through the first redistribution structure, the conductive pillars and the second redistribution structure.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1A:
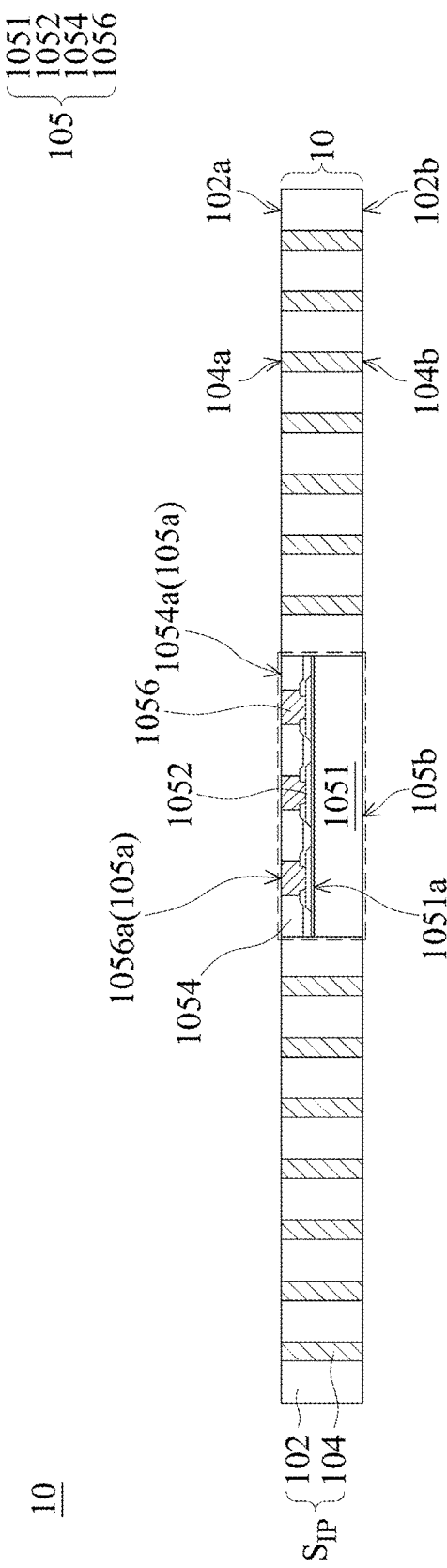
FIG. 1A, FIG. 1B, FIG. 1C, FIG. 1D, FIG. 1E and FIG. 1F are cross-sectional views of intermediate stages of a method of forming a semiconductor package, in accordance with some embodiments of the present disclosure.

The following description is of the best-contemplated mode of carrying out the invention. This description is made for the purpose of illustrating the general principles of the invention and should not be taken in a limiting sense. The scope of the invention is determined by reference to the appended claims.

The inventive concept is described fully hereinafter with reference to the accompanying drawings, in which exemplary embodiments of the inventive concept are shown. The advantages and features of the inventive concept and methods of achieving them will be apparent from the following exemplary embodiments that will be described in more detail with reference to the accompanying drawings. It should be noted, however, that the inventive concept is not limited to the following exemplary embodiments, and may be implemented in various forms. Accordingly, the exemplary embodiments are provided only to disclose the inventive concept and let those skilled in the art know the category of the inventive concept. Also, the drawings as illustrated are only schematic and are non-limiting. In the drawings, the size of some of the elements may be exaggerated for illustrative purposes and not drawn to scale. The dimensions and the relative dimensions do not correspond to actual dimensions in the practice of the invention.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It should be understood that when an element is referred to as being "coupled" or "contacting" to another element, it may be directly connected to or contacting the other element, or intervening elements may be present.

Similarly, it should be understood that when an element such as a layer, region or substrate is referred to as being "on" another element, it can be directly on the other element or intervening elements may be present. In contrast, the term "directly" means that there are no intervening elements. It should be understood that the terms "comprises", "comprising", "includes" and/or "including", when used herein, specify the presence of stated features, integers, steps, operations, elements, and/or components, but do not preclude the presence or addition of one or more other features, integers, steps, operations, elements, components, and/or groups thereof.

Furthermore, spatially relative terms, such as "under", "above", "lower", "upper" and the like, may be used herein for ease of description to describe one element or feature's relationship to another element(s) or feature(s) as illustrated in figures. The spatially relative terms are intended to encompass different orientations of the device in use or operation in addition to the orientation depicted in the figures. It should be understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concept explained and illustrated herein include their complementary counterparts. The same or similar reference numerals or reference designators denote the same or similar elements throughout the specification.

Some embodiments of the disclosure are described. It should be noted that additional procedures can be provided before, during, and/or after the stages described in these embodiments. Some of the stages that are described can be replaced or eliminated for different embodiments. Additional features can be added to the semiconductor package. Some of the features described below can be replaced or eliminated for different embodiments. Although some embodiments are discussed with procedures performed in a particular order, these procedures may be performed in another logical order.

According to some embodiments of the present disclosure, a semiconductor package and a method of forming the same are described below. In some embodiments, the lower die structure of the semiconductor package includes an interposer and a first integrated circuit die disposed in a semiconductor substrate of the interposer. The interposer includes several through-vias (e.g. through-silicon-vias; abbreviated as "TSVs"). The interposer that includes at least one integrated circuit dies can also be referred as an active TSV interposer. In some embodiments, the active TSV interposer in a package realizes a 3D-IC (three dimensional-integrated circuit) stacking structure instead of a 2.5D-IC structure using non-active TSV interposer. The active TSV interposer may include multi-dies. In addition, one or more integrated circuit dies in the lower die structure can be electrically coupled to the one or more integrated circuit dies in the upper die structure by the redistribution layers (abbreviated as "RDLs") and conductive pillars that penetrate the encapsulant without the use of bumps. Thus, 3D-IC stacking using an active TSV interposer, in accordance with some embodiments, is more flexible than conventional chip-on-chip or wafer-on-wafer connection (e.g. Cu—Cu bond). In addition, in some embodiments of the present disclosure, the active TSV interposer gives more flexibility for RDL routing design. The conductive line width and the line pitch (L/S) can be reduced to about 2.0/2.0 μm or less than about 2.0/2.0 μm, which breaks the bottleneck for package development. In addition, the active TSV interposer and the redistribution layers (RDLs) in accordance with some embodiments minimizes the signal path as to enhance the processing speed, and also has advantages of low power and low latency. In addition, in some embodiments, the thermal conductivity of the active TSV interposer that is made of silicon is greater than the thermal conductivity of the encapsulant (e.g. made of molding compound). The integrated circuit die(s) disposed in the active silicon TSV interposer have better thermal property. Therefore, chip-stacking connected by the active silicon TSV interposer in the embodiments may provide the solution to thermal issues, which is attributed to the integrated circuit die in the interposer with silicon fan-out (i.e. the bottom layer of the interposer).

One of the methods of forming a semiconductor package in accordance with some embodiments of the present disclosure is provided below. It should be noted that the present disclosure is not limited to the exemplified package structures and forming methods provided herein. Those structures and steps described below are merely for providing examples of the configuration and fabrication of the semiconductor package.

FIG. 1A, FIG. 1B, FIG. 1C, FIG. 1D, FIG. 1E and FIG. 1F are cross-sectional views of intermediate stages of a method of forming a semiconductor package, in accordance with some embodiments of the present disclosure. To simplify the diagram, only the structure in one die region is depicted in the drawings herein. The die region corresponds to a portion of a wafer after the wafer is diced along the scribe lines (e.g. the scribe lines Ls in FIG. 1E) in the subsequent process.

Referring to FIG. 1A, a first die structure 10 is provided. In some embodiments, the first die structure 10 includes an interposer $S_{IP}$ and a first integrated circuit die 105 disposed in the interposer $S_{IP}$. The interposer $S_{IP}$ includes a semiconductor substrate 102 and several through-vias 104 that penetrate through the semiconductor substrate 102. In some embodiments, the semiconductor substrate 102 is a silicon substrate, or a substrate including another suitable material.

In some embodiments, the first integrated circuit die 105 is disposed in the semiconductor substrate 102 of the interposer $S_{IP}$. In some embodiments, as shown in FIG. 1A, the first integrated circuit die 105 include an integrated circuit device 1051 and an interconnect structure 1052 on the integrated circuit device 1051 and coupled to the integrated circuit device 1051. The first integrated circuit die 105 further includes a dielectric layer 1054 over the integrated circuit device 1051, for example, disposed on the interconnect structure 1052. The first integrated circuit die 105 further includes several bond pads 1056 that are disposed in the dielectric layer 1054 and contact the interconnect structure 1052. The bond pads 1056 are electrically coupled to the integrated circuit device 1051 through the interconnect structure 1052.

In some embodiments, the top surface 105a of the first integrated circuit die 105 is coplanar with the top surface of the interposer $S_{IP}$. Specifically, as shown in FIG. 1A, the top surface 1056a of the bond pads 1056 and the top surface 1054a of the dielectric layer 1054 are coplanar with the top surface 102a of the semiconductor substrate 102 and the top surfaces 104a of the through-vias 104.

In addition, in some embodiments, a backside surface 105b of the first integrated circuit die 105 is coplanar with the bottom surface of the interposer $S_{IP}$. Specifically, as shown in FIG. 1A, the backside surface 105b of the first integrated circuit die 105 is coplanar with the bottom surface 102b of the semiconductor substrate 102 and the bottom surface 104b of the through-vias 104. According to some embodiment described above, the top surface 13a and the bottom surface 13b of the first redistribution structure 13 are planar surfaces.

Figure 1B:
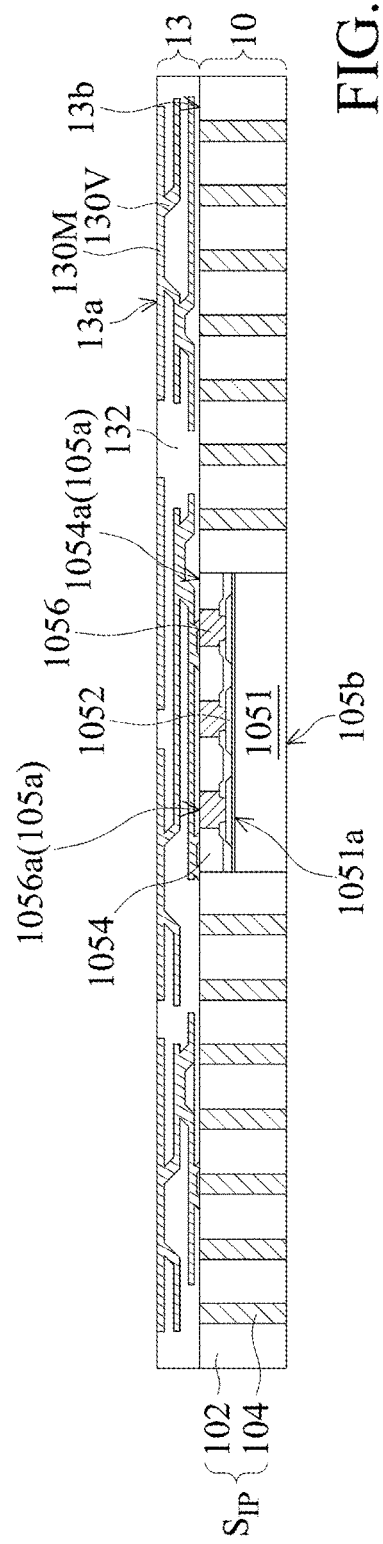

Referring to FIG. 1B, a first redistribution structure 13 is formed on the first die structure 10. In one example, the first redistribution structure 13 is provided above the integrated circuit device 1051 of the first integrated circuit die 105. The first redistribution structure 13 may include several dielectric layers 132 and conductive traces in the dielectric layers 132. The conductive traces may include metal lines 130M and conductive vias 130V connecting to the metal lines 130M. In addition, in this embodiment, the interconnect structure 1052 and the bond pads 1056 can be collectively referred as an active portion that provides an active surface of the first integrated circuit die 105, and the active surface of the first integrated circuit die 105 faces the first redistribution structure 13. Fan-out of the first integrated circuit die in the semiconductor substrate 102 can be achieved by the first redistribution structure 13 on the top surface of the interposer $S_{IP}$, the through-vias 104 in the interposer $S_{IP}$ and the bottom surface of the interposer $S_{IP}$.

In some embodiments, as shown in FIG. 1B, the metal lines 130M have fine widths and fine pitches. In some embodiments, the width of the metal line 130M is in the range of about 0.4 μm to about 2 μm, and the pitch of the metal lines 130M is in the range of about 0.4 μm to about 2 μm. In addition, the conductive material of the metal lines 130M may include a metal, like copper, titanium, tungsten, aluminum, or another suitable material. The dielectric layers 132 may be formed of a photo-sensitive material such as polybenzoxazole (PBO), polyimide, benzocyclobutene (BCB) or another suitable material. The dielectric layers 132 may be formed by spin coating, lamination, chemical vapor deposition (CVD), another suitable method, or a combination thereof.

In some embodiments, the first redistribution structure 13 is in physical contact with the top surface 102a of the semiconductor substrate 102 and the top surfaces 104a of the through-vias 104 of the interposer $S_{IP}$. The top surface 102a and the bottom surface 102b are on opposite sides of the semiconductor substrate 102, and the top surfaces 104a and the bottom surfaces 104b are on opposite sides of the through-vias 104.

In some embodiments, the first redistribution structure 13 entirely covers the first die structure 10. Specifically, as shown in FIG. 1B, the entire bottom surface 13b of the first redistribution structure 13 is in physical contact with the entire top surface 105a of the first integrated circuit die 105 and the entire top surface (e.g. level with the top surfaces 102a and 104a) of the interposer $S_{IP}$ of the first die structure 10.

According to some embodiments, the first integrated circuit die 105 is electrically coupled to the first redistribution structure 13. Specifically, the bond pads 1056 of the first integrated circuit die 105 are electrically coupled to the conductive traces (such as the metal lines 130M and the conductive vias 130V) of the first redistribution structure 13. As shown in FIG. 1B, the top surfaces 1056a of the bond pads 1056 of the first integrated circuit die 105 are in physical contact with the first redistribution structure 13.

Figure 1C:
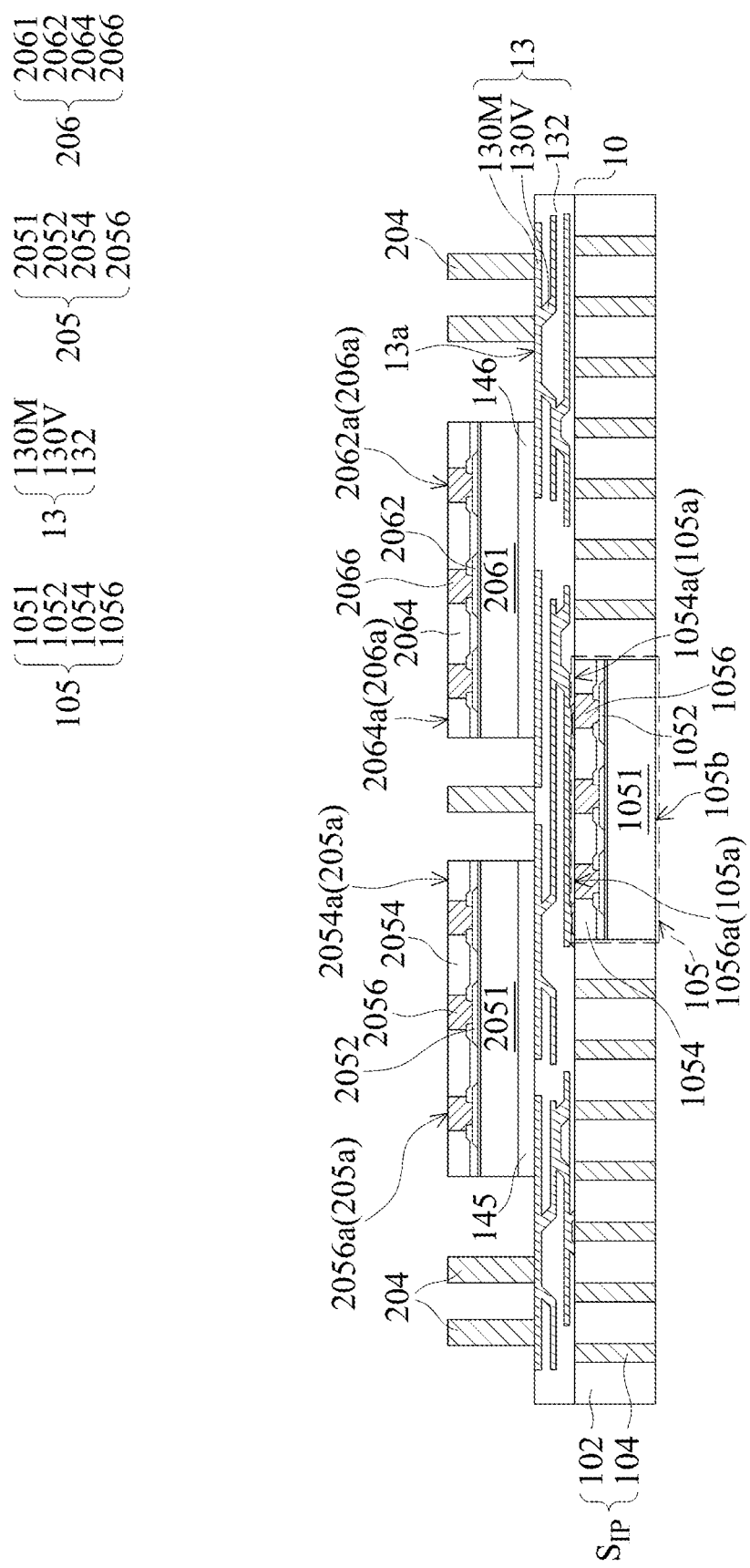
Figure 1D:
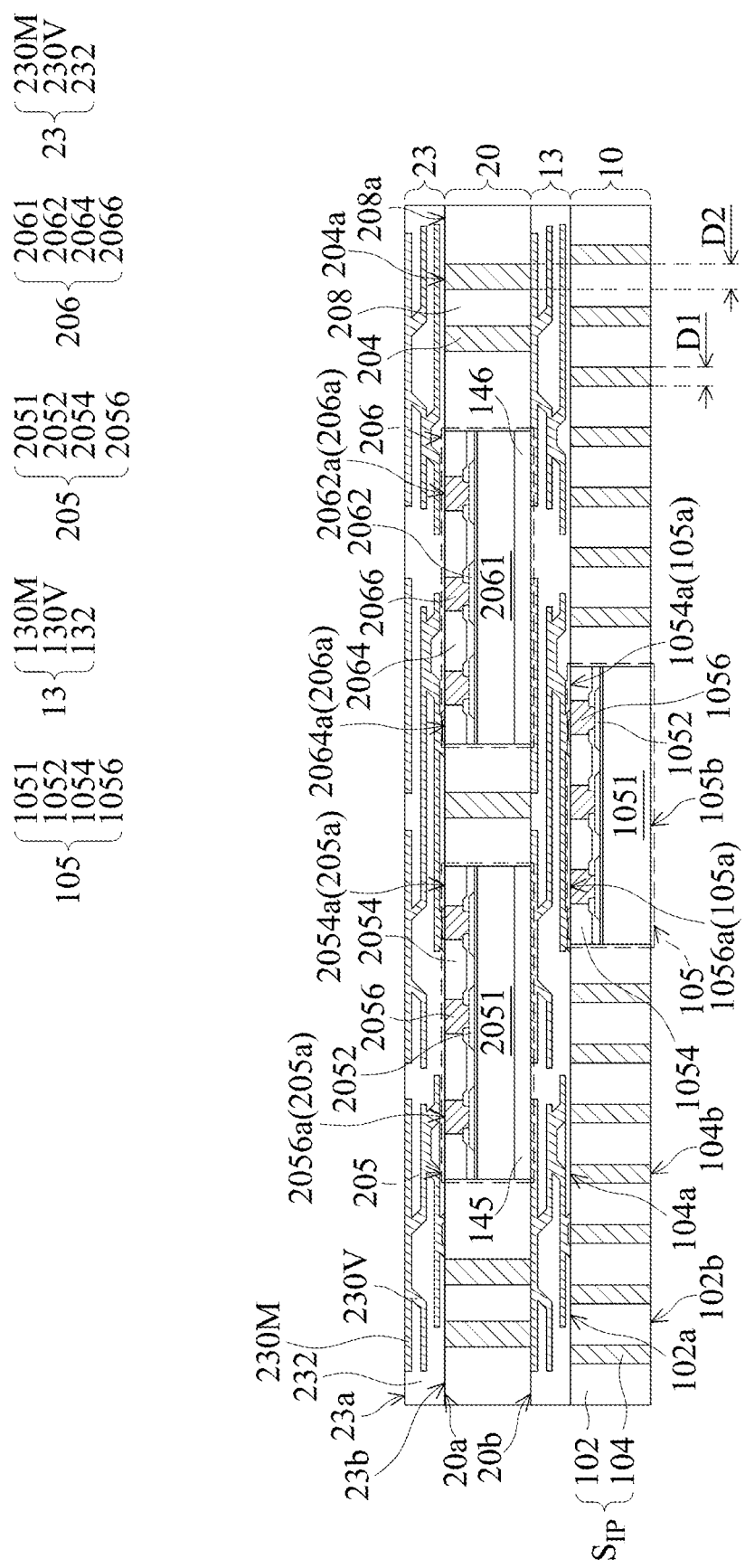

Next, in some embodiments, a second die structure 20 is formed on the first redistribution structure 13, and a second redistribution structure 23 is then formed on the second die structure 20. FIG. 1C and FIG. 1D illustrate one of the exemplified methods for forming the second die structure 20 and the second redistribution structure 23, in accordance with some embodiments of the present disclosure.

Referring to FIG. 1C, several conductive pillars 204 are formed on and extending away from the top surface 13a of the first redistribution structure 13. Specifically, the conductive pillars 204 are electrically coupled to the conductive traces (such as the metal lines 130M and the conductive vias 130V) of the first redistribution structure 13.

In one example to form the conductive pillars 204, a seed layer is formed on the first redistribution structure 13. The seed layer is a metal layer, which may be a single layer or a composite layer comprising a plurality of sub-layers formed of different materials. In a particular embodiment, the seed layer comprises a titanium layer and a copper layer over the titanium layer. The seed layer may be formed using physical vapor deposition (PVD) or another suitable method. A photoresist is formed and patterned on the seed layer. The photoresist may be formed by spin coating or another suitable method and may be exposed to light for patterning. The pattern of the photoresist corresponds to the conductive pillars 204. The patterning forms openings through the photoresist to expose the seed layer. A conductive material is formed in the openings of the photoresist and on the exposed portions of the seed layer. The conductive material may be formed by plating, such as electroplating or electroless plating, or another suitable method. The conductive material may comprise a metal, such as copper, titanium, tungsten, aluminum, or another suitable material. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet etching or dry etching. The remaining portions of the seed layer and conductive material form the conductive pillars 204. In this embodiment, the conductive pillars 204 are formed by copper, and can also be referred as copper pillars.

In addition, in some embodiments, each of the conductive pillars 204 has a critical dimension greater than each of the through-vias 104 of the interposer $S_{IP}$. As shown in FIG. 1D, each of the through-vias 104 of the interposer $S_{IP}$ has a first dimension (as its critical dimension) D1, each of the conductive pillars 204 of the second die structure 20 has a second dimension (as its critical dimension) D2, and the second dimension D2 is greater than the first dimension D1. The first dimension D1 and the second dimension D2 may be the diameters of the through-via 104 and the conductive pillar 204, respectively. In some embodiments, the first dimension D1 is in the range of about 10 μm to about 20 μm and the second dimension D2 is in the range of about 100 μm to about 200 μm. The number of input-output (I/O) counts of the bottom surface of the interposer $S_{IP}$ is significantly increased by forming the through-via 104 with smaller first dimension D1. In addition, the increased I/O number also contributes fan-out of the first integrated circuit die 10 in the interposer $S_{IP}$.

The second die structure 20 may include one or more second integrated circuit dies. In this exemplified embodiment, two second integrated circuit dies 205 and 206 of the second die structure 20 are formed for illustration. However, the number of the second integrated circuit die is not limited herein.

Referring to FIG. 1C, in this exemplified embodiment, the second integrated circuit die 205 includes an integrated circuit device 2051 and an interconnect structure 2052 on the integrated circuit device 2051. The interconnect structure 2052 is coupled to the integrated circuit device 2051. The second integrated circuit die 205 further includes a dielectric layer 2054 over the integrated circuit device 2051, for example, disposed on the interconnect structure 2052. The second integrated circuit die 205 further includes several bond pads 2056 that are disposed in the dielectric layer 2054 and contact the interconnect structure 1052. The bond pads 2056 are electrically coupled to the integrated circuit device 2051 through the interconnect structure 2052. Similarly, the second integrated circuit die 206 includes an integrated circuit device 2061 and an interconnect structure 2062 on the integrated circuit device 2061. The interconnect structure 2062 is coupled to the integrated circuit device 2061. The second integrated circuit die 206 further includes a dielectric layer 2064 over the integrated circuit device 2061, for example, disposed on the interconnect structure 2062. The second integrated circuit die 206 further includes several bond pads 2066 that are disposed in the dielectric layer 2064 and contact the interconnect structure 1062. The bond pads 2066 are electrically coupled to the integrated circuit device 2061 through the interconnect structure 2062. The second integrated circuit dies 205 and 206 may have the same function or different functions.

Referring to FIG. 1C, in this exemplified embodiment, the second integrated circuit dies 205 and 206 are attached to the first redistribution structure 13 through adhesive films 145 and 146, respectively. The adhesive film 145 may have edges flushed with edges of the second integrated circuit die 205, and the adhesive film 146 may have edges flushed with edges of the second integrated circuit die 206.

Next, referring to FIG. 1D, the conductive pillars 204 and the second integrated circuit dies 205 and 206 are encapsulated in an encapsulant 208. The encapsulant 208 may be a molding compound, which may include base material and filler particles in the base material. The base material may include a polymer, a resin, an epoxy, or the like. The base material may be a carbon-based polymer. The filler particles may be the particles of a dielectric material(s) such as $SiO_2$, $Al2O_3$, silica, the compound of iron (Fe), the compound of sodium (Na), or the like, and may have spherical shapes. The encapsulant 208 may be applied by compression molding, transfer molding, or another suitable molding method. In some embodiments, an encapsulant material can be formed over the first redistribution structure 13 such that the conductive pillars 204 and the second integrated circuit dies 205 and 206 are covered or buried. A planarization process such as a chemical mechanical polish (CMP) process or a mechanical grinding process is then performed to planarize the top surfaces of the second integrated circuit dies 205 and 206 and the encapsulant material until the second integrated circuit dies 205 and 206 are exposed. After the planarization process, the encapsulant 208 has a planar top surface 208a. The top surface 208a of the encapsulant 208 is coplanar with the top surface 205a of the second integrated circuit die 205 and the top surface 206a of the second integrated circuit die 206.

According to the exemplified embodiment of the present disclosure, the second integrated circuit dies 205 and 206 and the encapsulant 208 can be collectively referred as the second die structure 20.

Referring to FIG. 1D again, in some embodiments, a second redistribution structure 23 is formed on the second die structure 20. The second redistribution structure 23 may include several dielectric layers 232 and conductive traces (such as several metal lines 230M and several conductive vias 230V connecting to the metal lines 230M) in the dielectric layers 232. In some embodiments, the second integrated circuit dies 205 and 206 are electrically coupled to the conductive traces of the second redistribution structure 23. Specifically, as shown in FIG. 1D, the top surfaces 2056a of the bond pads 2056 of the second integrated circuit die 205 are in physical contact with the second redistribution structure 23. The top surfaces 2066a of the bond pads 2066 of the second integrated circuit die 206 are in physical contact with the second redistribution structure 23. In addition, in some embodiments, the top surface 23a and the bottom surface 23b of the second redistribution structure 23 are planar surfaces.

In this embodiment, the interconnect structure 2052 and the bond pads 2056 of the second integrated circuit die 205 can be collectively referred as an active portion that provides an active surface of the second integrated circuit die 205. Similarly, the interconnect structure 2062 and the bond pads 2066 of the second integrated circuit die 206 can be collectively referred as an active portion that provides an active surface of the second integrated circuit die 206. The active surfaces of the second integrated circuit dies 205 and 206 face the second redistribution structure 23, in accordance with some embodiments of the present disclosure.

The materials and methods for forming the components (such as dielectric layer 232, metal lines 230M and conductive vias 230V) of the second redistribution structure 23 in FIG. 1D can be the same as the related components (such as dielectric layer 132, metal lines 130M and conductive vias 130V) of the first redistribution structure 13 in FIG. 1B, which are not repeated herein.

According to some embodiments of the present disclosure, the conductive pillars (such as Cu pillars) 204 of the second die structure 20 are in physical contact with the first redistribution structure 13 and the second redistribution structure 23, for electrical connection of the first redistribution structure 13 and the second redistribution structure 23. In some embodiments, the second die structure 20 can be electrically coupled to the first die structure 10 through the second redistribution structure 23, the conductive pillars 204 and the first redistribution structure 13. Accordingly, the second integrated circuit dies 205 and 206 can be electrically coupled to the first integrated circuit die 105 through the second redistribution structure 23, the conductive pillars 204 and the first redistribution structure 13 without the use of bumps.

As shown in FIG. 1D, in some embodiments, the second redistribution structure 23 is in physical contact with the top surface 20a of the second die structure 20. The first redistribution structure 13 physically contacts the bottom surface 20b of the second die structure 20. The top surface 20a and the bottom surface 20b are on opposite sides of the second die structure 20. Specifically, the second redistribution structure 23 is in physical contact with the top surface 205a of the second integrated circuit die 205, the top surface 206a of the second integrated circuit die 206, the top surface 208a of the encapsulant 208 and the top surfaces 204a of the conductive pillars 204. As shown in FIG. 1D, in some embodiments, the top surfaces 204a and the bottom surfaces 204b of the conductive pillars 204 are in physical contact with the first redistribution structure 13 and the second redistribution structure 23, respectively.

In some embodiments, the second redistribution structure 23 entirely covers the second integrated circuit die structure 20. Specifically, as shown in FIG. 1D, the entire bottom surface 23b of the second redistribution structure 23 is in physical contact with the entire top surface 205a of the second integrated circuit die 205, the entire top surface 206a of the second integrated circuit die 206, the entire the entire top surface 208a of the encapsulant 208 and the entire top surfaces 204a of the conductive pillars 204.

In addition, the first integrated circuit die 105 and the second integrated circuit dies 205 and 206 may have the same function or different functions. Each of the first integrated circuit die 105 and the second integrated circuit dies 205, 206 may be a logic die (e.g., central processing unit (CPU), graphics processing unit (GPU), system-on-a-chip (SoC), application processor (AP), microcontroller, etc.), a memory die (e.g., dynamic random access memory (DRAM) die, static random access memory (SRAM) die, etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) dies), or the like.

In some embodiments, the semiconductor substrate 102 of the interposer $S_{IP}$ of the first die structure 10 has a first thermal conductivity and the encapsulant 208 of the second die structure 20 has a second thermal conductivity, wherein the first thermal conductivity is greater than the second thermal conductivity. Thus, the first integrated circuit die 105 may be a die that generates large amounts of heat during operation since the interposer $S_{IP}$ has better thermal property than the encapsulant 208. For example, the first integrated circuit die 105 disposed in the semiconductor substrate 102 of the interposer $S_{IP}$ may be a logic die that generates considerable heat during operation, and the second integrated circuit die 205/206 may be a memory die that generates less heat during operation.

Figure 1E:
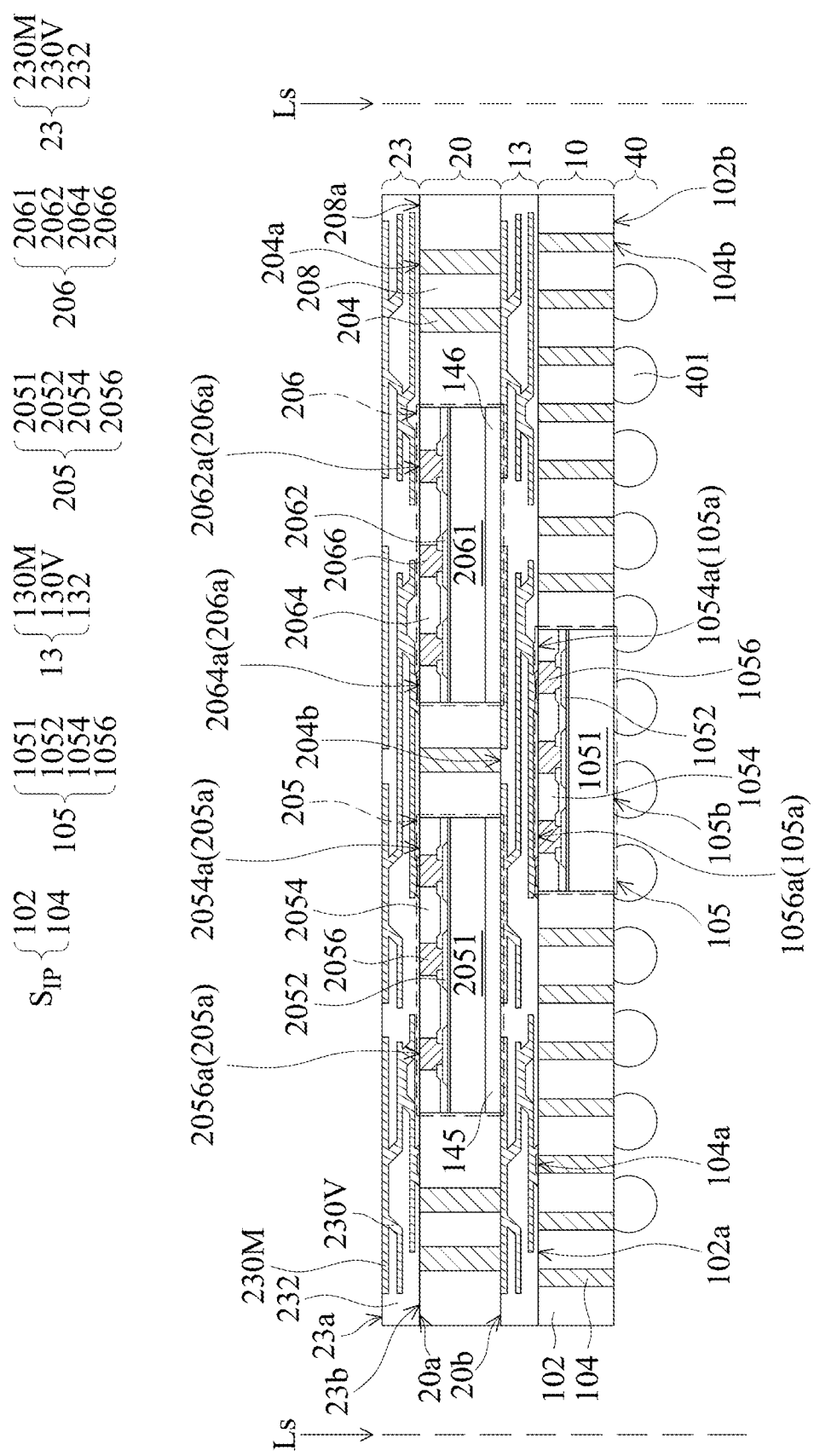

Next, referring to FIG. 1E, in some embodiments, a conductive connector array 40 is formed on the bottom surface of the first die structure 10. The conductive connector array 40 includes several conductive connectors 401, and the conductive connectors 401 are formed on the bottom surface of the interposer $S_{IP}$. The conductive connectors 401 of the conductive connector array 40 are electrically connected to the through-vias 104 of the interposer $S_{IP}$ of the first die structure 10.

The conductive connectors 401 may be solder balls, metal pillars, controlled collapse chip connection (C4) bumps, micro bumps, electroless nickel-electroless palladium-immersion gold technique (ENEPIG) formed bumps, or the like. The conductive connectors 401 may include a conductive material such as copper, aluminum, gold, nickel, silver, palladium, tin, solder, another suitable material, or a combination thereof. In some embodiments, the conductive connectors 401 are formed by initially forming a layer of solder through evaporation, electroplating, printing, solder transfer, ball placement, or another suitable method. Once a layer of solder has been formed on the structure, a reflow may be performed in order to shape the material into the desired bump shapes. In another embodiment, the conductive connectors 401 comprise metal pillars (such as a copper pillar) formed by a sputtering, printing, electro plating, electroless plating, chemical vapor deposition (CVD), or another suitable method. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, another suitable material, or a combination thereof and may be formed by a plating process. In this embodiment, the conductive connectors 401 are controlled collapse chip connection (C4) bumps.

After forming the conductive connectors 401, the resulting structure is singulated into individual integrated circuit packages. FIG. 1E depicts one individual integrated circuit package after the singulation process is performed. A singulation process is performed by sawing along the scribe lines Ls. The singulation process separates one integrated circuit package from adjacent integrated circuit packages. In some embodiments, the singulation process may include sawing, laser ablation, etching, a combination thereof, or another suitable method. Then, the resulting singulated integrated circuit package may be mounted to a substrate by the conductive connectors 401.

Figure 1F:
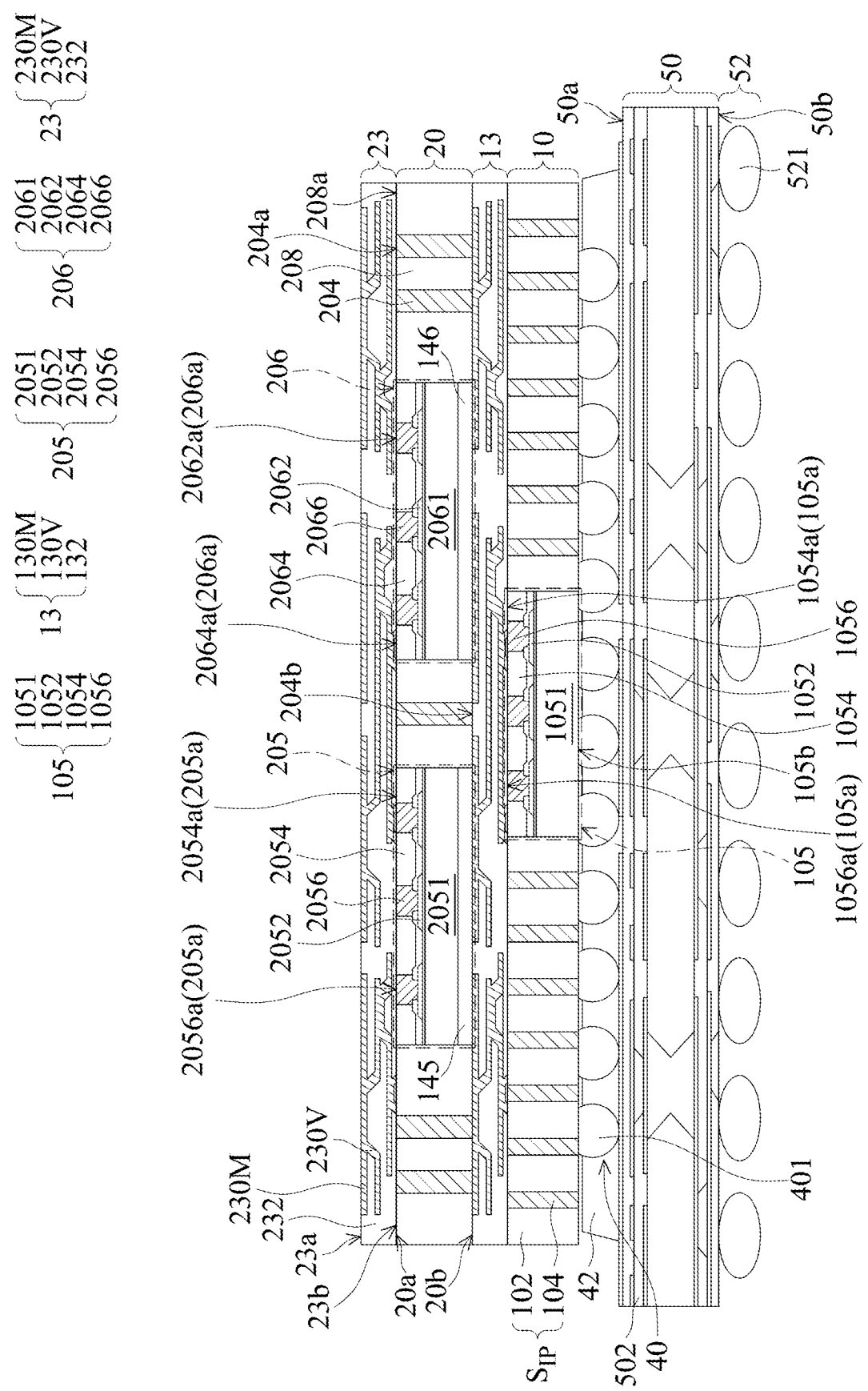

Referring to FIG. 1F, in some embodiments, a substrate 50 with interconnect traces 502 is provided, and the resulting structure in FIG. 1E is mounted to the substrate 50 by the conductive connectors 401. That is, the conductive connectors 401 are positioned between the substrate 50 and the first die structure 10. Accordingly, the through-vias 104 of the interposer $S_{IP}$ of the first die structure 10 are electrically coupled to the interconnect traces 502 of the substrate 50 by the conductive connectors 401 of the conductive connector array 40.

In addition, an underfill layer 42 is formed between the first die structure 10 and the substrate 50. In some embodiments, an underfill material may be dispensed into the remaining spaces between the conductive connectors 401, and the underfill material fills the gaps between first die structure 10 and the substrate 50. The underfill material is then cured to form the underfill layer 42 using a curing process. In some other embodiments, the underfill layer 42 may be formed by a capillary flow process or another suitable method after the conductive connectors 401 are bonded to the substrate 50.

As shown in FIG. 1F, in some embodiments, the first integrated circuit die 105 of the first die structure 10 can be electrically connected to the substrate 50 through the first redistribution structure 13, the through-vias 104 of the interposer $S_{IP}$ and the conductive connectors 401 of the conductive connector array 40. The second integrated circuit dies 205 and 206 of the second die structure 20 can be electrically connected to the substrate 50 through the second redistribution structure 23, the conductive pillars 204, the first redistribution structure 13, the through-vias 104 of the interposer $S_{IP}$ and the conductive connectors 401 of the conductive connector array 40. In some embodiments, the second integrated circuit dies 205 and 206 can be electrically coupled to the first integrated circuit die 105 by the second redistribution structure 23, the conductive pillars 204 and the first redistribution structure 13.

According to some embodiments described above, a semiconductor package and a method of forming the same achieve several advantages. In some embodiments, the lower die structure in the semiconductor package includes an interposer $S_{IP}$ and a first integrated circuit die disposed in the semiconductor substrate 102 of the interposer $S_{IP}$ with several through-vias (TSVs) 104. The interposer $S_{IP}$ that includes at least one integrated circuit die can also be referred as an active TSV interposer. Compared to conventional 2.5D-IC (2.5 dimensional-integrated circuit) package that uses a non-active TSV interposer, the active TSV interposer in a package realizes the 3D-IC stacking package, in accordance with some embodiments. The active TSV interposer may include multi-dies. In some embodiments, heterogeneous integration with multi-functional devices, passive components or memory can be integrated by fan-out process of the upper die structure.

In addition, one or more of integrated circuit dies in a lower die structure can be electrically coupled to the one or more of integrated circuit dies in an upper die structure by the redistribution layers (RDLs)(such as the second redistribution layer 23 and the first redistribution layer 13) and conductive pillars 204 that penetrate the encapsulant 208 without the use of bumps. Thus, 3D-IC stacking by an active TSV interposer is more flexible than conventional chip-on-chip or wafer-on-wafer (Cu—Cu bond) stacking. According to some embodiments, flexibility to chip array/floor plan can be achieved by fan out of the upper die structure and silicon fan-out of the bottom die structure (such as the active TSV interposer), irrespectively.

In addition, in some embodiments of the present disclosure, the active TSV interposer gives more flexibility for RDL routing design, and the conductive line width and the line pitch (L/S) of the RDLs can be greatly reduced, which breaks the bottleneck for package development. For example, the conductive line width and the line pitch (L/S) of the second redistribution layer 23 on the encapsulant 208 can be reduced to about 2.0/2.0 μm or less than 2.0/2.0 μm. In one example, the conductive line width and the line pitch (L/S) of the first redistribution layer 13 on a silicon interposer $S_{IP}$ (e.g. the semiconductor substrate 102 made of silicon) can be reduced to about 0.4/0.4 μm. Also, the die-to-die stacking that includes RDL interconnection and the active TSV interposer has greater number of input/output (I/O) count than micro bumps in a conventional 2.5D semiconductor package. Accordingly, the package having the stacking structure, such as having the active TSV interposer and the redistribution layers (RDLs), in accordance with some embodiments, minimizes the signal path as to enhance the processing speed, and also has advantages of low power and low latency.

In addition, in some embodiments, the TSV interposer made of silicon has higher thermal conductivity than the encapsulant 208 (e.g. made of molding compound). Accordingly, one of more integrated circuit die that generate large amount of heat during operation can be disposed in the silicon TSV interposer for achieving better thermal property.

Figure 2:
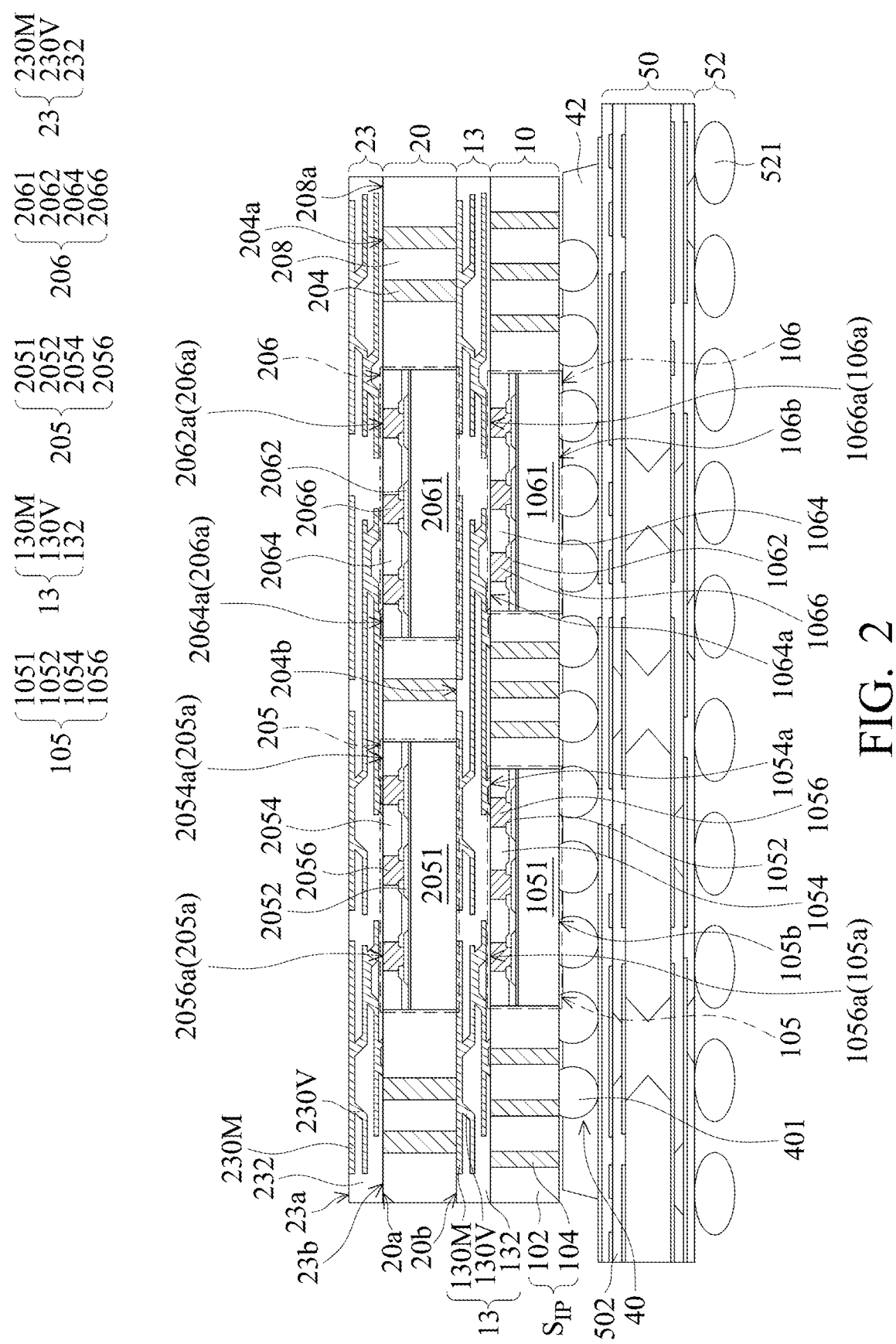
FIG. 2 is a cross-sectional view of a semiconductor package, in accordance with some embodiments of the present disclosure.

Although one first integrated circuit die 105 is depicted in FIG. 1A to FIG. 1F, the first die structure 10 may include more first integrated circuit dies (e.g., two, three, four, etc.). FIG. 2 is a cross-sectional view of a semiconductor package, in accordance with some embodiments of the present disclosure. The same or similar reference numerals or reference designators denote the same or similar elements (such as components or layers) in FIG. 1A to FIG. 1F and FIG. 2. For the purpose of brevity, the materials of the same or similar components/layers and processes of forming those components/layers are not repeated herein.

Referring to FIG. 2, the first die structure 10 that includes first integrated circuit dies 105 and 106 is exemplified according to one embodiment of the present disclosure. The components/layers and processes for forming those components/layers of the first integrated circuit die 105 have been described above, and not repeated herein. The first integrated circuit die 106 may have the similar components/layers as the first integrated circuit die 105. It should be noted that the configuration and the number of the first integrated circuit dies illustrated in FIG. 2 are provided for exemplification, and the present disclosure is not limited thereto.

In some embodiments, the first integrated circuit die 106 is disposed in the semiconductor substrate 102 of the interposer $S_{IP}$. The first integrated circuit dies 105 and 106 can be physically separated from each other by the semiconductor substrate 102 of the interposer $S_{IP}$. In some embodiments, the first integrated circuit die 106 include an integrated circuit device 1061 and an interconnect structure 1062 on the integrated circuit device 1061 and coupled to the integrated circuit device 1061. The first integrated circuit die 106 further includes a dielectric layer 1064 over the integrated circuit device 1061, for example, disposed on the interconnect structure 1062. The first integrated circuit die 106 further includes several bond pads 1066 that are disposed in the dielectric layer 1064 and contact the interconnect structure 1062. The bond pads 1066 are electrically coupled to the integrated circuit device 1061 through the interconnect structure 1062. In addition, in the exemplified embodiment, the interconnect structure 1062 and the bond pads 1066 can be collectively referred as an active portion that provides an active surface of the first integrated circuit die 106. The active surfaces of the first integrated circuit dies 105 and 106 face the first redistribution structure 13.

In some embodiments, the top surface 106a and the backside surface 106b of the first integrated circuit die 106 are respectively coplanar with the top surface and the bottom surface of the interposer $S_{IP}$. As shown in FIG. 2, the first redistribution structure 13 is formed on and entirely covers the first integrated circuit dies 105 and 106. Specifically, the entire bottom surface 13b of the first redistribution structure 13 is in physical contact with the entire top surface 105a of the first integrated circuit die 105, the entire top surface 106a of the first integrated circuit die 106 and the entire top surface of the interposer $S_{IP}$ of the first die structure 10.

According to some embodiments, the first integrated circuit die 106 is electrically coupled to the first redistribution structure 13. Specifically, the bond pads 1066 of the first integrated circuit die 106 are electrically coupled to the conductive traces (such as the metal lines 130M and the conductive vias 130V) of the first redistribution structure 13. In the exemplified embodiment, as shown in FIG. 2, the first integrated circuit die 106 can be electrically coupled to the substrate 50 through the first redistribution structure 13, the through-vias 104 of the interposer $S_{IP}$ and the conductive connectors 401 of the conductive connector array 40.

The first integrated circuit dies 105 and 106 may have the same function or different functions. The first integrated circuit dies 105 and 106 and the second integrated circuit dies 205 and 206 may have the same function or different functions. The first integrated circuit die 106 may be a logic die (e.g., central processing unit (CPU), graphics processing unit (GPU), system-on-a-chip (SoC), application processor (AP), microcontroller, etc.), a memory die (e.g., dynamic random access memory (DRAM) die, static random access memory (SRAM) die, etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) dies), or the like.

In some embodiments, the semiconductor substrate 102 of the interposer $S_{IP}$ of the first die structure 10 has a first thermal conductivity and the encapsulant 208 of the second die structure 20 has a second thermal conductivity. The first thermal conductivity is greater than the second thermal conductivity. Thus, the first integrated circuit die 106 may be a die (such as a logic die) that generates large amounts of heat during operation since the interposer $S_{IP}$ has better thermal property than the encapsulant 208.

Although the second die structure 20 is vertically stacked over the first die structure 10 (i.e. an TSV interposed having one or more first integrated circuit dies, which can be also regarded as an active TSV interposer) in FIG. 1A to FIG. 1F and FIG. 2, the semiconductor package may include another one or more die structures over the second die structure 20, in accordance with some embodiments of the present disclosure.

Figure 3:
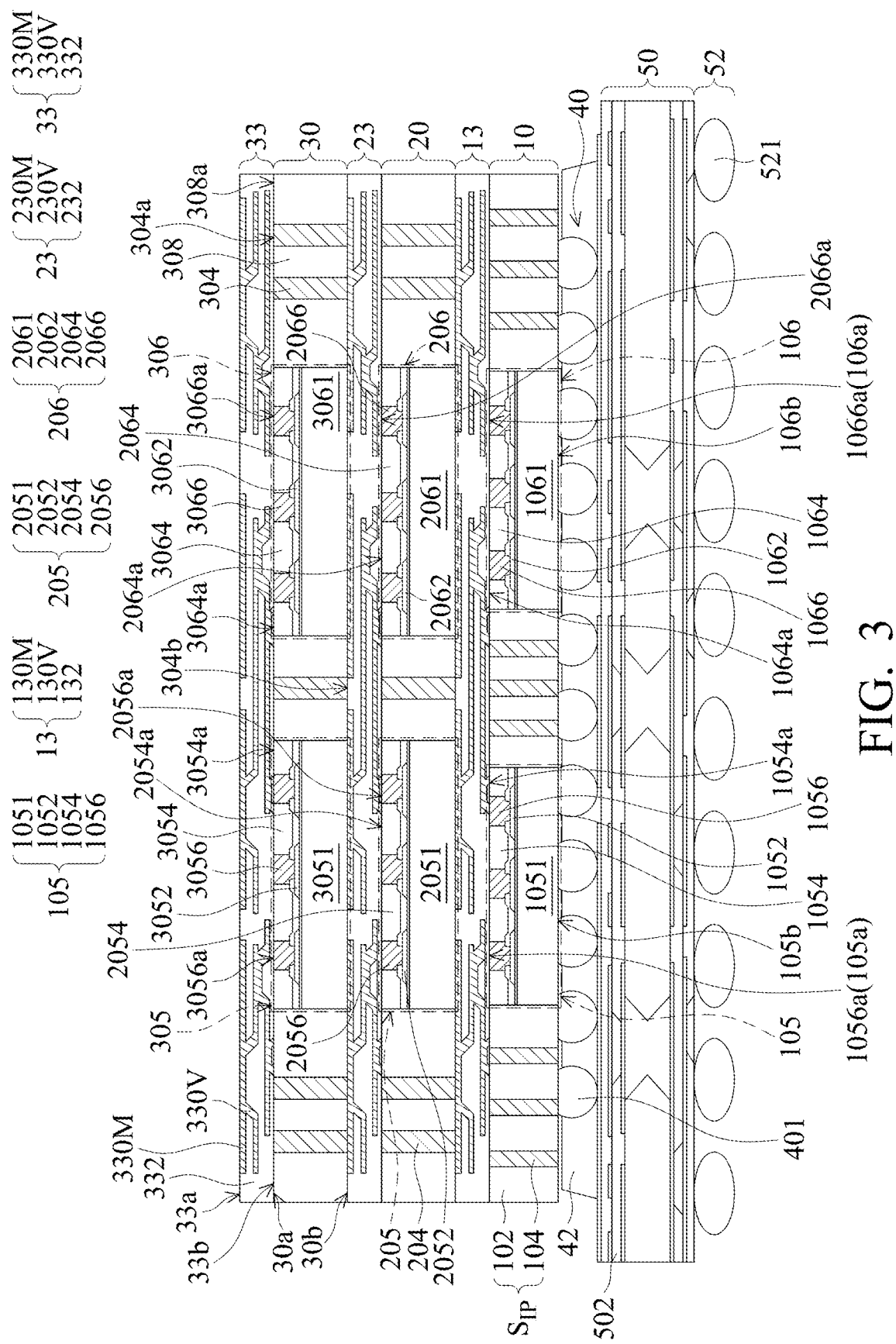
FIG. 3 is a cross-sectional view of a semiconductor package, in accordance with some embodiments of the present disclosure.

FIG. 3 is a cross-sectional view of a semiconductor package, in accordance with some embodiments of the present disclosure. The same or similar reference numerals or reference designators denote the same or similar elements (such as components or layers) in FIG. 1A to FIG. 1F and FIG. 3. For the purpose of brevity, the materials and arrangements of the same or similar components/layers and processes for forming those similar components/layers of the first die structure 10, the first redistribution structure 13, the second die structure 20 and the second redistribution structure 23 are not repeated herein.

Referring to FIG. 3, in some embodiments, a semiconductor package may further include a third die structure 30 over the second die structure 20, for example, the third die structure 30 is disposed on the second distribution structure 23. The third die structure 30 may include one or more third integrated circuit dies.

In this exemplified embodiment, as shown in FIG. 3, the encapsulant 208 of the second die structure 20 can be referred as a first encapsulant 208. The third die structure 30 includes the third integrated circuit dies 305 and 306 encapsulated in a second encapsulant 308. The third integrated circuit dies 305 and 306 may be physically separated from each other by the second encapsulant 308.

The third integrated circuit die 305 may include an integrated circuit device 3051, an interconnect structure 3052 coupled to the integrated circuit device 3051, a dielectric layer 3054 over the integrated circuit device 3051 and several bond pads 3056 disposed in the dielectric layer 3054. The bond pads 3056 are electrically coupled to the integrated circuit device 3051 through the interconnect structure 3052. The third integrated circuit die 306 may include an integrated circuit device 3061, an interconnect structure 3062 coupled to the integrated circuit device 3061, a dielectric layer 3064 over the integrated circuit device 3061 and several bond pads 3066 disposed in the dielectric layer 3064. The bond pads 3066 are electrically connected to the integrated circuit device 3061 through the interconnect structure 3062. The third integrated circuit dies 305 and 306 may have the same function or different functions.

In this exemplified embodiment, as shown in FIG. 3, the conductive pillars 204 of the second die structure 20 can be referred as first conductive pillars 204. The third die structure 30 further includes second conductive pillars (such as Cu pillars) 304 that penetrate through the second encapsulant 308. Two ends (i.e. the top surfaces 304a and the bottom surfaces 304b) of the second conductive pillars 304 respectively contact the second distribution structure 23 and a third distribution structure 33 (described below) over the third die structure 30. The materials and processes for forming the second conductive pillars 304 of the third die structure 30 may be the same or similar to the materials and processes for forming the first conductive pillars 204 of the second die structure 20. Those details are not repeated herein.

In addition, in some embodiments, the semiconductor package further includes a third distribution structure 33 disposed on the third die structure 30. The third distribution structure 33 may have a planar top surface 33a and a planar bottom surface 33b. In some embodiments, the third distribution structure 33 is in physical contact with the top surface 30a of the third die structure 30, and the second redistribution structure 23 is in physical contact with the bottom surface 30b of the third die structure 30.

In some embodiments, the third distribution structure 33 includes several dielectric layers 332 and conductive traces in the dielectric layers 332. The conductive traces may have several metal lines 330M and several conductive vias 330V connecting to the metal lines 330M, thereby providing electrical connect function of the third distribution structure 33.

In this exemplified embodiment, as shown in FIG. 3, the third integrated circuit dies 305 and 306 are electrically coupled to the substrate 50 through the third distribution structure 33, the second conductive pillars 304, the second distribution structure 23, the first conductive pillars 204, the first distribution structure 13, the through-vias 104 of the interposer $S_{IP}$ and the conductive connectors 401 of the conductive connector array 40. In some embodiments, the third integrated circuit dies 305 and 306 are electrically coupled to the second integrated circuit dies 205 and 206 by the third distribution structure 33, the second conductive pillars 304 and the second distribution structure 23 without the use of bumps. In some embodiments, the third integrated circuit dies 305 and 306 are electrically coupled to the first integrated circuit dies 105 and 106 by the third distribution structure 33, the second conductive pillars 304, the second distribution structure 23, the conductive pillars 204 and the first redistribution structure 13 without the use of bumps.

According to some embodiments described above, the semiconductor packages and the methods of forming the same achieve several advantages. In some embodiments, the lower die structure of the semiconductor package includes an interposer $S_{IP}$ and one or more first integrated circuit dies disposed in a semiconductor substrate 102 of the interposer $S_{IP}$ with several through-vias (TSVs) 104. The interposer $S_{IP}$ that includes at least one integrated circuit die can also be referred as an active TSV interposer. Compared to conventional 2.5D-IC (2.5 dimensional-integrated circuit) package that uses a non-active TSV interposer, the active TSV interposer in a package realizes the 3D-IC stacking package, in accordance with some embodiments. The active TSV interposer may include multi-dies. In some embodiments, heterogeneous integration with multi-functional devices, passive components or memory can be integrated by fan-out process of the upper die structure.

In addition, one or more of integrated circuit dies in a lower die structure can be electrically coupled to the one or more of integrated circuit dies in an upper die structure by the redistribution layers (RDLs)(such as the first redistribution layer 13, the second redistribution layer 23 and/or the third redistribution layer 33) and the conductive pillars 204 that penetrate the encapsulant 208 (and the conductive pillars 304 that penetrate the encapsulant 308) without the use of bumps. Thus, 3D-IC stacking by an active TSV interposer is more flexible than conventional chip-on-chip or wafer-on-wafer (Cu—Cu bond) stacking. According to some embodiments, flexibility to chip array/floor plan can be achieved by fan out of the upper die structure and silicon fan-out of the bottom die structure (such as the active TSV interposer), irrespectively. In addition, in some embodiments, the active TSV interposer made of silicon has higher thermal conductivity than the encapsulant 208/308 (e.g. made of molding compound), so that the integrated circuit die disposed in the silicon TSV interposer has better thermal property.

In addition, in some embodiments of the present disclosure, the active TSV interposer gives more flexibility for RDL routing design, and the conductive line width and the line pitch (L/S) of the RDLs can be greatly reduced, which breaks the bottleneck for package development. For example, the line width and the line pitch (L/S) of the RDLs can be reduced to about 2.0/2.0 μm or less when the RDL is on the encapsulant 208/308, and reduced to about 0.4/0.4 μm when the RDL is on the silicon interposer $S_{IP}$. In addition, the die-to-die stacking with RDL interconnection and the active TSV interposer has greater number of input/output (I/O) count than micro bumps in a conventional 2.5D semiconductor package. According to the aforementioned descriptions, a package having the stacking structure (such as having the active TSV interposer and the RDLs) in accordance with some embodiments minimizes the signal path as to enhance the processing speed, and also has advantages of low power and low latency.

It should be noted that the details of the structures and fabrications of the embodiments are provided for exemplification, and the described details of the embodiments are not intended to limit the present disclosure. It should be noted that not all embodiments of the invention are shown.

Modifications and variations can be made without departing from the spirit of the disclosure to meet the requirements of the practical applications. Thus, there may be other embodiments of the present disclosure which are not specifically illustrated. Furthermore, the accompanying drawings are simplified for clear illustrations of the embodiment. Sizes and proportions in the drawings may not be directly proportional to actual products. Thus, the specification and the drawings are to be regard as an illustrative sense rather than a restrictive sense.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor package, comprising:
   a first die structure, comprising:
      an interposer comprising a semiconductor substrate and through-vias penetrating through the semiconductor substrate; and
      a first integrated circuit die disposed in the semiconductor substrate of the interposer;
   a first redistribution structure disposed on a top surface of the semiconductor substrate of the interposer of the first die structure;
   a second die structure disposed on the first redistribution structure, the second die structure comprising:
      a second integrated circuit die encapsulated in an encapsulant; and
      conductive pillars penetrating through the encapsulant;
   a second redistribution structure disposed on the second die structure,
   wherein the first integrated circuit die is electrically coupled to the second integrated circuit die through the first redistribution structure, the conductive pillars and the second redistribution structure; and
   conductive connectors directly disposed on a bottom surface of the semiconductor substrate of the interposer, wherein the bottom surface of the semiconductor substrate of the interposer is coplanar with a backside surface of the first integrated circuit die, and the conductive connectors are directly connected to the through-vias of the interposer of the first die structure.

2. The semiconductor package as claimed in claim 1, wherein an active surface of the first integrated circuit die faces the first redistribution structure, and an active surface of the second integrated circuit die faces the second redistribution structure.

3. The semiconductor package as claimed in claim 1, wherein the first redistribution structure is in physical contact with the top surface of the semiconductor substrate of the interposer.

4. The semiconductor package as claimed in claim 1, wherein a backside surface of the second integrated circuit die is disposed on the first redistribution structure.

5. The semiconductor package as claimed in claim 1, wherein the conductive pillars of the second die structure are in physical contact with the first redistribution structure and the second redistribution structure.

6. The semiconductor package as claimed in claim 1, wherein the through-vias of the first die structure physically contact the first redistribution structure.

7. The semiconductor package as claimed in claim 1, wherein each of the first integrated circuit die and the second integrated circuit die comprises:
an integrated circuit device;
an interconnect structure coupled to the integrated circuit device;
a dielectric layer over the integrated circuit device; and
bond pads disposed in the dielectric layer, wherein the bond pads are electrically coupled to the interconnect structure and the first redistribution structure.

8. The semiconductor package as claimed in claim 7, wherein top surfaces of the bond pads are coplanar with a top surface of the dielectric layer.

9. The semiconductor package as claimed in claim 7, wherein top surfaces of the bond pads of the first integrated circuit die physically contact the first redistribution structure.

10. The semiconductor package as claimed in claim 7, wherein top surfaces of the bond pads of the second integrated circuit die physically contact the second redistribution structure.

11. The semiconductor package as claimed in claim 1, further comprising:
an underfill layer formed between the interposer and a substrate with interconnect traces, wherein the conductive connectors are positioned between the substrate and the first die structure.

12. The semiconductor package as claimed in claim 11, wherein the through-vias of the interposer of the first die structure are electrically coupled to the interconnect traces of the substrate by the conductive connectors.

13. The semiconductor package as claimed in claim 1, wherein a backside surface of the second integrated circuit die is coplanar with a bottom surface of the encapsulant, and the bottom surface of the encapsulant physically contacts a top surface of the first redistribution structure.

14. The semiconductor package as claimed in claim 1, wherein the semiconductor substrate of the interposer of the first die structure has a first thermal conductivity, and the encapsulant of the second die structure has a second thermal conductivity, wherein the first thermal conductivity is greater than the second thermal conductivity.

15. The semiconductor package as claimed in claim 1, wherein the first die structure further comprises:
a third integrated circuit die disposed in the semiconductor substrate of the interposer, wherein the first redistribution structure is disposed on and electrically coupled to the third integrated circuit die; and
the second die structure further comprises:
a fourth integrated circuit die encapsulated in the encapsulant, wherein the second redistribution structure is disposed on and electrically coupled to the fourth integrated circuit die.

16. The semiconductor package as claimed in claim 1, further comprising:
a third die structure disposed on the second redistribution structure; and
a third distribution structure disposed on the third die structure.

17. The semiconductor package as claimed in claim 16, wherein the encapsulant of the second die structure is referred as a first encapsulant and the conductive pillars of the second die structure are referred as first conductive pillars, wherein the third die structure comprises:
a third integrated circuit die encapsulated in a second encapsulant; and second conductive pillars penetrating through the second encapsulant,
wherein the third integrated circuit die is electrically coupled to the first conductive pillars through the third distribution structure, the second conductive pillars and the second distribution structure.

18. The semiconductor package as claimed in claim 1, wherein each of the through-vias of the interposer has a first dimension, and each of the conductive pillars of the second die structure has a second dimension, wherein the second dimension is greater than the first dimension.

19. A semiconductor package, comprising:
a first die structure comprising a first integrated circuit die that is disposed in a semiconductor substrate of an interposer, wherein the interposer has through-vias penetrating through the semiconductor substrate;
a first redistribution structure disposed on a top surface of the semiconductor substrate of the interposer of the first die structure;
a second die structure disposed on the first redistribution structure, wherein the second die structure comprises a second integrated circuit die that is encapsulated in an encapsulant and conductive pillars that penetrate through the encapsulant;
a second redistribution structure disposed on the second die structure,
wherein top surfaces of bond pads of the first integrated circuit die physically contact the first redistribution structure, and top surfaces of bond pads of the second integrated circuit die physically contact the second redistribution structure; and
conductive connectors directly disposed on a bottom surface of the semiconductor substrate of the interposer, wherein the bottom surface of the semiconductor substrate of the interposer is coplanar with a backside surface of the first integrated circuit die, and the conductive connectors are directly connected to the through-vias of the interposer of the first die structure.

20. The semiconductor package as claimed in claim 19, wherein the second integrated circuit die is electrically coupled to the first integrated circuit die through the second redistribution structure, the conductive pillars and the first redistribution structure.

21. The semiconductor package as claimed in claim 19, wherein a backside surface of the second integrated circuit die physically contacts the first redistribution structure.

22. The semiconductor package as claimed in claim 19, wherein a backside surface of the second integrated circuit die is coplanar with a bottom surface of the encapsulant.

23. The semiconductor package as claimed in claim 19, wherein a bottom surface of the first redistribution structure entirely covers and physically contacts the first integrated circuit die and the interposer of the first die structure.

24. The semiconductor package as claimed in claim 19, wherein the second redistribution structure entirely covers and physically contacts the second integrated circuit die and the encapsulant of the second die structure.

25. A method of forming a semiconductor package, comprising:
providing a first die structure that comprises a first integrated circuit die disposed in a semiconductor substrate of an interposer, wherein the interposer has through-vias penetrating through the semiconductor substrate;
forming a first redistribution structure on a top surface of the semiconductor substrate of the interposer of the first die structure;
forming a second die structure on the first redistribution structure, wherein the second die structure comprises a second integrated circuit die that is encapsulated in an encapsulant and conductive pillars that penetrate through the encapsulant;

forming a second redistribution structure on the second die structure, wherein the first integrated circuit die is electrically coupled to the second integrated circuit die through the first redistribution structure, the conductive pillars and the second redistribution structure; and forming conductive connectors directly on a bottom surface of the semiconductor substrate of the interposer, wherein the bottom surface of the semiconductor substrate of the interposer is coplanar with a backside surface of the first integrated circuit die, and the conductive connectors are directly connected to the through-vias of the interposer of the first die structure.

26. The method of forming the semiconductor package as claimed in claim 25, wherein top surfaces of bond pads of the first integrated circuit die physically contact the first redistribution structure, and top surfaces of bond pads of the second integrated circuit die physically contact the second redistribution structure.

27. The method of forming the semiconductor package as claimed in claim 25, wherein forming the second die structure comprises:

attaching the second integrated circuit die to a top surface of the first redistribution structure;

forming the conductive pillars on the top surface of the first redistribution structure; and encapsulating the conductive pillars and the second integrated circuit die using the encapsulant.

28. The method of forming the semiconductor package as claimed in claim 27, wherein a top surface of the encapsulant is coplanar with the top surfaces of the conductive pillars and a top surface of the second integrated circuit die.

29. The method of forming the semiconductor package as claimed in claim 25, further comprising:

performing a singulation on the resulting structure to form individual integrated circuit packages.

30. The method of forming the semiconductor package as claimed in claim 29, wherein after the singulation is performed, the method further comprises:

providing a substrate with interconnect traces;

bonding the conductive connectors to the substrate, wherein the conductive connectors are electrically coupled to the interconnect traces of the substrate and the through-vias of the interposer; and forming an underfill layer between the interposer and the substrate, wherein the conductive connectors are encapsulated in the underfill layer.

31. The method of forming the semiconductor package as claimed in claim 30, wherein the conductive connectors are bonded to a top surface of the substrate, and ball grid array (BGA) connectors are bonded to a bottom surface of the substrate.

* * * * *